(12) United States Patent
Fredrickson et al.

(10) Patent No.: US 6,263,032 B1
(45) Date of Patent: Jul. 17, 2001

(54) PHASE DETECTOR ESTIMATOR

(75) Inventors: Lisa Fredrickson, Ojai; Vladimir Kovner; Dennis W. Hogg, both of Simi Valley, all of CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 08/945,063

(22) PCT Filed: Jul. 22, 1997

(86) PCT No.: PCT/US97/12743

§ 371 Date: Oct. 14, 1997

§ 102(e) Date: Oct. 14, 1997

(87) PCT Pub. No.: WO98/04074

PCT Pub. Date: Jan. 29, 1998

Related U.S. Application Data

(60) Provisional application No. 60/024,465, filed on Aug. 20, 1996, and provisional application No. 60/022,291, filed on Jul. 22, 1996.

(51) Int. Cl.[7] ........................................ H04L 7/02
(52) U.S. Cl. ..................... 375/355; 375/373; 375/376; 327/9; 327/12; 327/155; 327/159; 327/161; 331/25
(58) Field of Search .................................. 375/371, 373, 375/375, 376, 355; 327/9, 12, 2, 7, 150–163; 455/260; 331/25

(56) References Cited

U.S. PATENT DOCUMENTS

| | | | |
|---|---|---|---|
| 5,022,052 | 6/1991 | Stephens | 375/25 |
| 5,216,554 | * 6/1993 | Schneider | 360/51 |
| 5,272,725 | 12/1993 | Jones et al. | 375/76 |
| 5,504,790 | * 4/1996 | Shrinkle | 377/43 |
| 5,638,010 | 6/1997 | Adams | 327/105 |

* cited by examiner

*Primary Examiner*—Amanda T. Le
(74) *Attorney, Agent, or Firm*—Shawn B. Dempster; Mitchel Mcarthy; Kirk A. Cesari

(57) ABSTRACT

A phase detector for a timing control loop provided in a signal sampling system to control taking samples by a sampler of input signals provided to a signal sampling system to result in a signal sample sequence output using a slope estimator and an error determiner with a phase error estimator combiner. The combiner output is provided to a summer directly and through a delay element to form phase error estimates.

16 Claims, 9 Drawing Sheets

PHASE DETECTOR ESTIMATOR

This application claims benefit of provisional application Ser. No. 60/024,465 filed Aug. 26, 1996 which is a provisional application Ser. No. 60,022,291 filed Jul. 22, 1996.

BACKGROUND OF THE INVENTION

The present invention relates to sampled signal detection systems and, more particularly, to such systems used in information storage systems.

In information storage systems such as digital magnetic recording systems, data is recorded in a moving magnetic media layer by a storage, or "write", electrical current-to-magnetic field transductor, or "head", positioned immediately adjacent thereto. The data is stored or written to the magnetic media by switching the directions of flow of a substantially constant magnitude write current provided through windings in the storage transducer. Each such write current transition to an opposite direction flow results in a corresponding reversal of the magnetization direction, in that portion of the magnetic media just passing by the transducer during the changing of the current direction, with respect to the magnetization direction in that media induced by the previous current flow in the opposite direction. In one coding scheme, often termed "nonreturn-to-zero inverted (NRZI), each magnetization direction reversal over a portion of the media moving past the transducer represents a binary digit "1" and the lack of any such reversal in that portion represented a binary digit "0".

When data so stored is to be subsequentially recovered, a retrieval, or "read" magnetic field-to-voltage transducer (which may be the same as the storage transducer if both rely on inductive coupling between the media fields and the transducer), or "head", is positioned to have the magnetic media, containing the previously stored data, pass thereby. Such passing by of the media adjacent to the transducer permits the flux accompanying the magnetization reversal regions in that media to induce a corresponding voltage pulse in forming an output analog read signal for that retrieval transducer or, alternatively, permits the flux accompanying these magnetization reversal regions to, in turn, change a transducer circuit parameter to thereby provide such an output signal voltage pulse. In the coding scheme described above, each such voltage pulse in the read transducer output signal due to the reversal of magnetization directions between adjacent media portions passing the transducer represents a binary digit "1", and the absence of a pulse in correspondence with such portions represents a binary digit "0".

Digit data magnetic recording systems have used peak detection methods for the detection of such voltage pulses in the retrieved analog signal as the basis for digitizing this signal. Such methods are based on determining which peaks in that signal exceed a selected threshold to determine that a binary digit "1" related pulse occurred in the retrieved signal, and also use the times between those voltage pulses to reconstruct the timing information used in the preceding recording operation in which the data were stored in the magnetic media as described above. The analog retrieved signal is provided to a phase-locked loop forming a controlled oscillator, or a phase-lock oscillator or synchronizer, which produces an output timing signal, or "clock" signal, from the positions of the detected peaks in this analog retrieved signal. Absolute time is not used in operating the data retrieval system portion since the speed of the magnetic media varies over time during both the storage operation and the retrieval operation to result in nonuniform time intervals, or nonuniform multiples thereof, occurring between the voltage pulses in the analog retrieved signal.

In more recent digital data magnetic recording systems, partial response signaling is used which involves the acceptance of a predetermined degree of intersymbol interference occurring between the recovered data pulses involved in forming the transducer analog output signal which pulses again represent data symbols obtained from the recorded binary data. Such an arrangement allows for an increased density of data being stored in the magnetic media. Data recovery proceeds by periodically sampling the amplitude of this analog retrieved signal as the basis for digitizing this signal, the taking of such samples being initiated by pulses in the clocking signal supplied by a phase-lock oscillator. The magnitudes of the samples initiated by this clocking signal have magnitude contributions to them by more than one pulse representing a retrieved binary digit because of the planned intersymbol interference.

As part of providing a signal transmission channel with frequency response characteristics suitable for partial response signaling, digital magnetic recording systems often choose a type of partial response signaling system termed a class 4 system. Such a system is particularly suitable for magnetic recording in view of the nature of the spectrum of the resulting analog retrieved signal because the signal channel requires relatively little equalization by the equalizer used therewith to provide a channel frequency characteristic substantially matching the class 4 system signal spectrum. In such a class 4 partial response signaling system, the magnitudes of the retrieved signal waveform after equalization at any sampling instant has a contribution thereto from the magnitude of that pulse, representing a corresponding recorded binary digit, newly included in the analog retrieved signal near that instant, if any, but not from the immediately preceding pulse one sampling clock period earlier. There will, however, be a further contribution from the magnitude of the next earlier occurring pulse, if any, in the signal waveform two sampling clock periods but not from others occurring even earlier. As a result, samples of the analog retrieved waveform can be divided into two interleaved subsequences with one containing the even numbered samples and the other containing the odd numbered samples. Each such subsequence can be submitted independently to a Viterbi detector as part of a maximum likelihood symbol detection arrangement.

Here, too, the analog retrieved signal in such a partial response signaling system is provided to a phase-lock oscillator as the basis for recovering the clocking signal reflected in the timing represented by the occurrences of pulses representing digital data in the analog retrieved signal, i.e. the analog read signal from the transducer. Accurate recovery of the binary information in this signal requires accuracy in the times of taking samples of that signal, and in the corresponding synchronization of the operation of the rest of the detection system therewith. One requirement for successfully recovering this timing information is that there not be too many "0" bit symbols in a row in the binary data which would lead to too few pulses occurring in the analog read signal forming the basis from which the phase-lock oscillator derives such timing information. This need is satisfied by properly precoding the data provided for recording on the magnetic disk media using a code having a nature that results in preventing any such inordinately log sequences of "0" data bits.

The average frequency of the phase-lock oscillator representing the derived timing of the occurrence of pulses representing binary data in the analog read signal must clearly equal the average frequency of the occurrence of pulses in that read signal since the read detection system must generate as many data bits, based on the frequency of sampling, as were actually recorded. However, even having met this requirement, the phase-lock oscillator output clocking signal will exhibit phase variation representing variations in just where each pulse in the analog read signal is sampled over its duration. This variation in the timing phase is usually referred to as phase jitter or timing jitter. Such jitter must be controlled in the clocking signal of the phase-lock oscillator to achieve accurate sampling.

The analog read signal, x(t), as provided by the read transducer, is initially subjected to analog signal processing operations including amplification and equalization. The resulting processed analog read signal, y(t), after such analog processing, is then read for sampling, and will be sampled at times which can be represented as (kT+τ[k]). The period of the clocking signal, i.e. the sampling interval, is designated T so that the time to the current period is kT where k is an appropriate integer giving the number of sampling intervals which have occurred since the initial interval, and the phase error τ[k] represents the timing error in the $k^{th}$ sampling interval. Thus, the sample currently taken has a magnitude value of y(kT+τ[k]). That is, at sample time (kT+τ[k]), the phase-lock oscillator output clock signal causes a sample-and-hold circuit to hold the then current value of y(t) to create an analog sample value of y(kT+τ[k]), or sample[i], which is then sent to an analog-to-digital converter for conversion into an equivalent digital value.

In a partial response system absent noise in the channel, the output of the equalizer y(t) ideally is one of three sample values, +1, 0 or −1, obtained at the beginning of each sampling period. However, because of asymmetries and scaling effects occurring in the partial response signal transmission system channel, the actual voltage values obtained in noiseless samples will be found instead to be $V_{s+}$, 0, and $V_{g-}$ in correspondence with these ideal sample just set out above to provide the actually used system ideal sample values, ideal[i], representing the value of the $i^{th}$ ideal sample without providing the specific time dependence. The values for $V_{s+}$ and $V_{g-}$ can be obtained from an averaging arrangement for finding average values for high and low value samples.

Because of noise, timing jitter, and other signal transmission defects, the sample value measured at a sampling period sample [i] will not usually be equal to one of the ideal sample values ideal[i]. Thus, there will instead be an error having a value equal to $$\text{error}[i]=\text{sample}[i]-\text{ideal}[i].$$

This error has been controlled in the past with respect timing jitter contributions by adaptively adjusting the timing phase in a feedback loop using in that loop an unbiased, minimum variance estimator for the desired loop timing function of $$\hat{z}=\text{sample}[i]\cdot\text{ideal}[i-1]+\text{sample}[i-1]\cdot\text{ideal}[i]$$

to establish the nature of the loop as $$\tau[i+1]=\tau[i]-c\hat{z}[i]$$

to provide recursive timing phase corrections. Such a system is shown in FIG. 1.

In the system of FIG. 1, a magnetic material covered disk, 10, containing pluralities of magnetization direction reversals along each of a plurality of more or less concentric, circular tracks is rotated past a data retrieval transducer arrangement, 11, or "read head", positioned adjacent a selected track by a "head" positioner and initial signal processor, 12, about a spindle, 13, to provide an initial analog read signal x(t). This signal is subjected to further processing in a variable gain amplifier, 14, and subsequently in a linear channel equalizer, 15.

Equalizer 15 has, beginning from its input, a succession of delay elements, 16, to form a delay line with each of element 16 providing a delay of T seconds, nominally equal to the sampling interval, to input signals provided thereto by passing those input signals through a cascade of three T/3 delay filters therein. Thus, x(t) is presented to the input of equalizer 15 to be introduced into this delay line with successive versions thereof delayed by T seconds being tapped from this delay line and provided to corresponding ones of a plurality of tap weight multipliers, 17, to be multiplied by the associated tap weight value, $w_n$. The weighted values form multipliers 17 are summed in summers, 18, to provide the analog output y(t) of equalizer 15. Changes in the tap weights are provided from a plurality of corresponding weighting change multipliers, 19, based on multiplying the corresponding delayed version of the input signal x(t) by a scaled version of an error signal determined from samples taken of the output signal y(t) in a sampler, 20, based on a sample and hold circuit. These samples are supplied to an error determiner, 21, along with the scaled ideal values for such samples from a source thereof, 22, from which determiner 21 determines the error which is passed through a magnitude scaler, 23, to weighting change multipliers 19.

The samples obtained in sampler 20 and the scaled ideal sample values are also supplied to corresponding T second delay elements, 24 and 25, respectively, and directly to a phase detector, 26, to which the delayed versions from delay elements 24 and 25 are also supplied. Phase detector 26 uses these inputs to form the estimate described above which is scaled by a step size multiplier, 27, and then used to control a voltage-controlled oscillator that provides the sampling clock signal to sampler 20 to initiate the taking of each sample of y(t) and to synchronize other actions in the signal processing system.

Although this provides a useable timing error correction arrangement, the timing errors are not corrected as well as possible in those situations in which there are successive samples with values of zero. In this situation, the estimator z can be seen to being subject to taking a value of zero on such occasions so that no timing error corrections will be provided on such occasions. Thus, there is desired a timing error correction arrangement providing better timing error correction without a significant increase in complexity.

SUMMARY OF THE INVENTION

The present invention provides a phase detector for a timing control loop provided in a signal sampling system to control taking samples by a sampler of input signals provided to a signal sampling system to result in a signal sample sequence output using a slope estimator receiving the input signals to provide signal slope estimates from signal magnitudes in sampling intervals and an error determiner receiving samples from the sampler to provide error magnitude indications corresponding to the samples received based on differences in magnitude occurring between such said samples and expected values of such samples. A phase error estimation combiner is electrically connected to the slope estimator and the error determiner to provide phase error estimates at said output thereof for corresponding sampling intervals based on the error magnitude indications as selectively modified by the slope estimates. A signal delayer provides phase error estimates from the phase error estimation combiner to a summer delayed for corresponding sampling interval, and the summer also receives current phase error estimates directly from the phase error estimation combiner. The summer provides an output signal which is the algebraic sum of the current and delayed phase error estimates.

The slope estimator can be connected to a signal delayer delaying the input signals for a selected fraction of a current one of the sampling intervals to aid the slope estimator in determining magnitude values of signals transmitted through the signal delayer during sampling intervals to provide estimates of slopes of such signals for corresponding sampling intervals. A said second signal delayer to further delay the input signals transmitted therethrough for a selected fraction of current sampling intervals to further aid the slope estimator to determine magnitude values of signals transmitted through the first and second signal delayers during sampling intervals.

DETAILED DESCRIPTION OF THE PREFERRED EMBODIMENTS

Reducing the error in samples due to timing errors in the sampling is alternatively accomplished by forming the expected value of the square of this error, i.e. the mean-squared error, and minimizing it with respect to the timing jitter. Such an effort requires finding the timing error gradient of this mean squared error which must be set to zero and solved. The difficulties in finding the minimum mean squared error leads to instead using the timing error gradient of the squared error itself as a basis for adaptively adjusting the timing phase toward a minimum without having to find a mean value. This results in a stochastic gradient which is used for the recursive adjusting of the timing phase in a direction opposite thereto in a feedback loop, or $$\tau[k+1] = \tau[k] - \alpha \frac{\partial}{\partial \tau}(\text{error}[k])^2,$$

where $\alpha$ is a step size or scaling parameter multiplying the timing error stochastic gradient. The stochastic gradient of the squared error with respect to the timing or phase error is found to be $$\frac{\partial}{\partial \tau}(\text{error}[k])^2 = \frac{\partial}{\partial \tau}(\text{sample}[k] - \text{ideal}[k])^2$$

$$= \frac{\partial}{\partial \tau}\{y(kT + \tau[k]) - \text{ideal}[k]\}^2$$

$$= 2\{y(kT + \tau[k]) - \text{ideal}[k]\}\frac{\partial}{\partial \tau[k]}y(kT + \tau[k])$$

$$= 2(\text{error}[k])\frac{\partial}{\partial \tau}y(kT + \tau[k]).$$

This gradient is then used in a feedback loop in the phase-lock oscillator system to update the voltage controlled oscillator used therein on the basis $$\tau[k+1] = \tau[k] - \beta \text{error}[k]\frac{\partial}{\partial \tau}y(kT + \tau[k]).$$

Here, the parameter $\beta$ (in which the constant 2 is incorporated) sets the updating step size and has a value determined so as to provide stability for the phase-lock oscillator while allowing it to track changes in the timing of the pulses in the equalized analog read signal.

Figure 1:
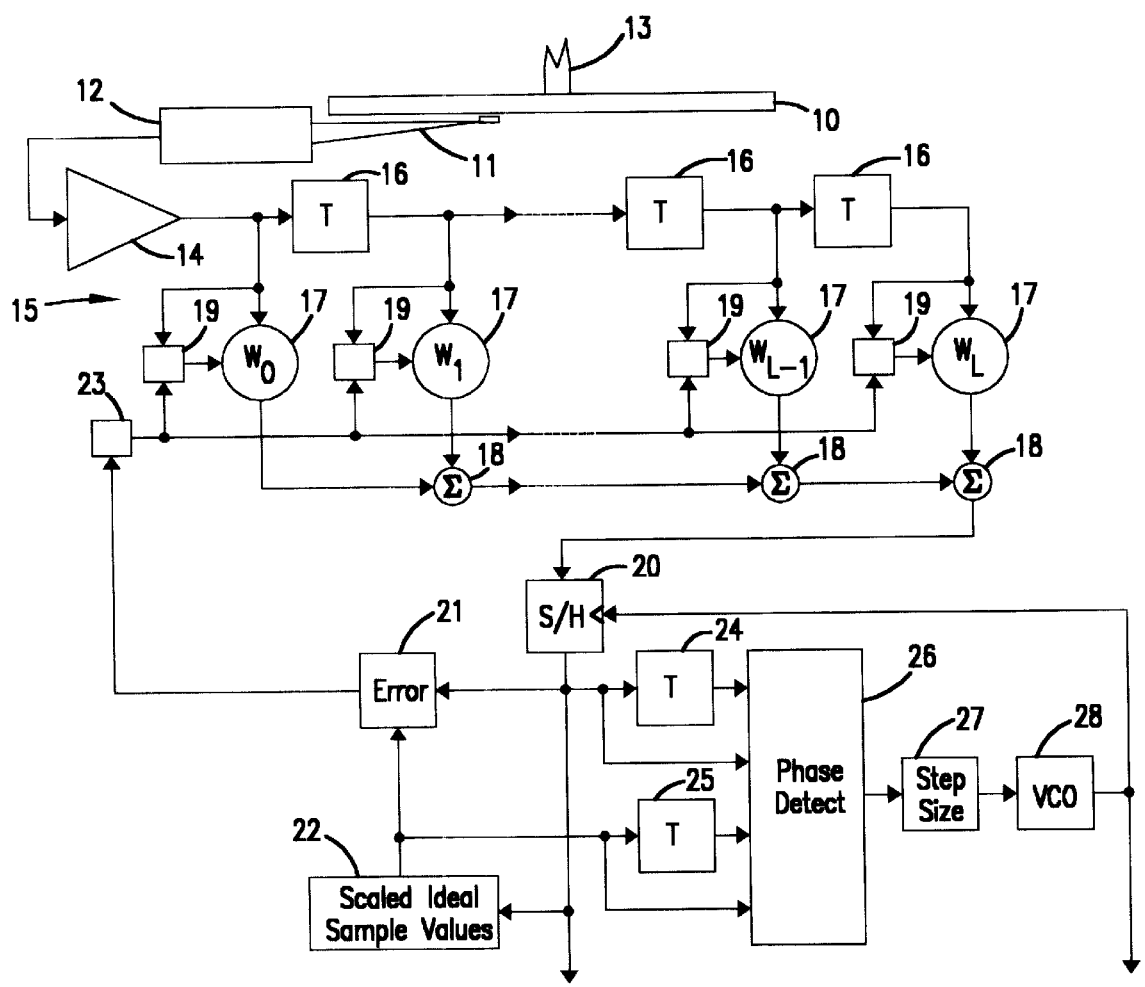
FIG. 1 is a block diagram of a timing error correction system from the prior art.

Thus, the phase-lock oscillator loop must be supplied with the error in the sampling of the equalized analog read signal along with the gradient of that signal with respect to the timing phase, or estimates thereof, as a basis for operating that loop. Typically, as indicated above, an equalizer will have been used in the partial response signal transmission system channel, and typically one that is adaptive so as to be able to adapt to changes occurring in that system channel as in the system of FIG. 1. A typical linear adaptive equalizer will use the least means square error algorithm as a basis for such adaptation which correlates an estimate of the error in a current sample error[i]with the signal present at the input of each multiplier used in the transversal filter structure forming that equalizer to thereby provide a small adjustment in the gain of the multiplier. Thus, the system will typically have available an error signal, or an estimate of that error signal based on the associated scaled ideal sample values, for purposes of adaptation in the equalizer.

In addition, the phase-lock oscillator loop must be supplied with an estimate of the slope of the signal being sampled at the time of sampling. Since the magnitude of the signal based on the gradient that is supplied to the loop is scaled, the algebraic sign of the gradient is a sufficient estimate. Although an analog differentiator circuit could be used for this purpose, such circuits tend to enhance noise and so are often unsatisfactory.

Figure 2A:
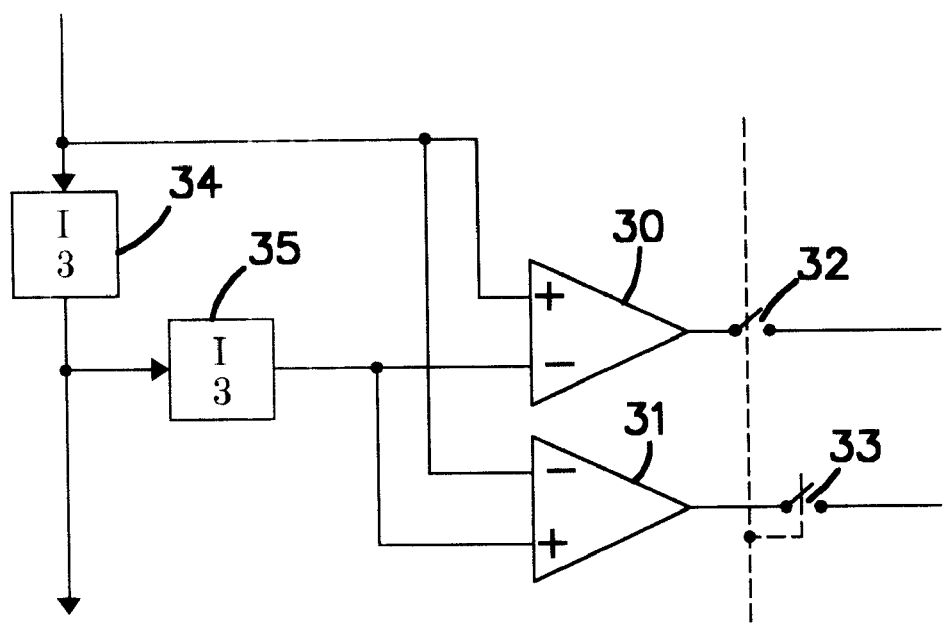
FIGS. 2A, 2B, 2C and 2D are block diagrams of subsystems involved in the present invention.

FIG. 2A shows a slope sign estimator circuit that estimates the slope as always either positive or negative by placing a "1" binary logic value at either one or the other of the positive outputs of a pair of comparators, 30 and 31, and so at one side of either a positive slope indicating single pole, single throw switch, 32, or a negative slope indicating single pole, single throw switch, 33. The analog signal y(t) from the output of equalizer 15 is applied to the noninverting input of comparator 30 and the inverting input of comparator 31, and that signal delayed by 2T/3 seconds through two T/3 delay elements, 34 and 35, is connected to the inverting input of comparator 30 and the noninverting input of comparator 31. Comparator 30 has its output connected to one side of switch 32 and comparator 31 has its output is connected to one side of switch 33.

Thus, if y(t) is greater than y(t−2T/3), a positive slope is estimated with comparator 30 then having a binary "1" value at its output and comparator 31 having a binary "0" value at its output. A reversal of the relative signal magnitudes leads to a reversal of the outputs on comparators 30 and 31. The following equation for the associated slope estimator $\hat{z}$ summarizes this behavior:

$$\hat{m} = \begin{cases} -1 \text{ if } y(t) < y\left(t - \frac{2T}{3}\right) \\ 1 \text{ if } y(t) > y\left(t - \frac{2T}{3}\right) \end{cases}.$$

The binary values on the outputs of comparators 30 and 31 are transmitted through switches 32 and 33 by a clocking signal on the dashed switch activation lines which control the opening and closing of these switches. The signal sent on for sampling from this estimator is the signal at the output of delay element 34, and so is delayed from the output of equalizer 15 by T/3 seconds. Thus, the slope estimation made from the equalizer output signal values at times t and t−2T/3 is based on signal values occurring symmetrically in time on either side of the sample value y(t−T/3) taken at time t−T/3 to thereby provide a slope estimate of this signal about the sample value.

Figure 2B:
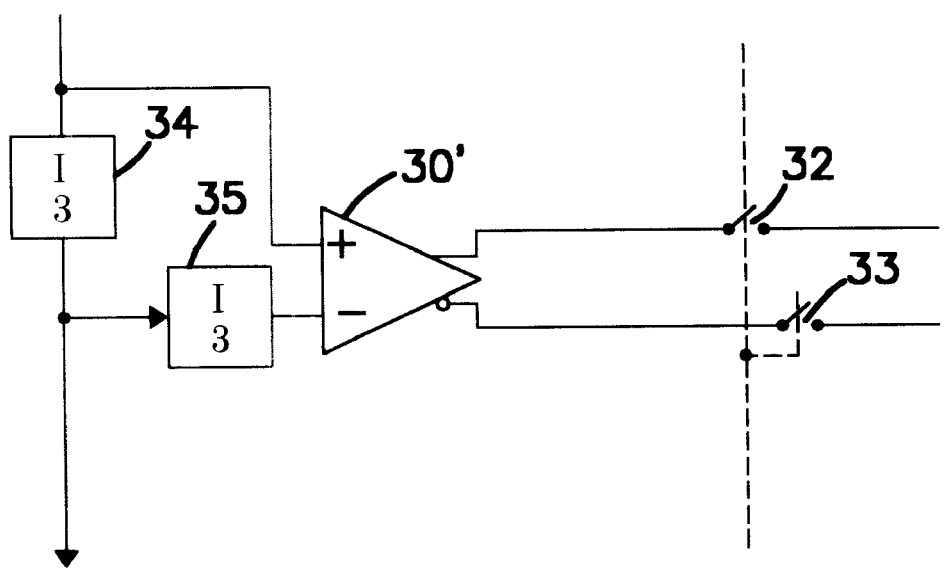

FIG. 2B shows that the provision of a negative logic output on comparator 30 in addition to a positive logic output thereon, i.e. providing a fully differential comparator, allows eliminating comparator 31. Comparator 30 has been redesignated 30' in FIG. 2B.

Figure 2C:
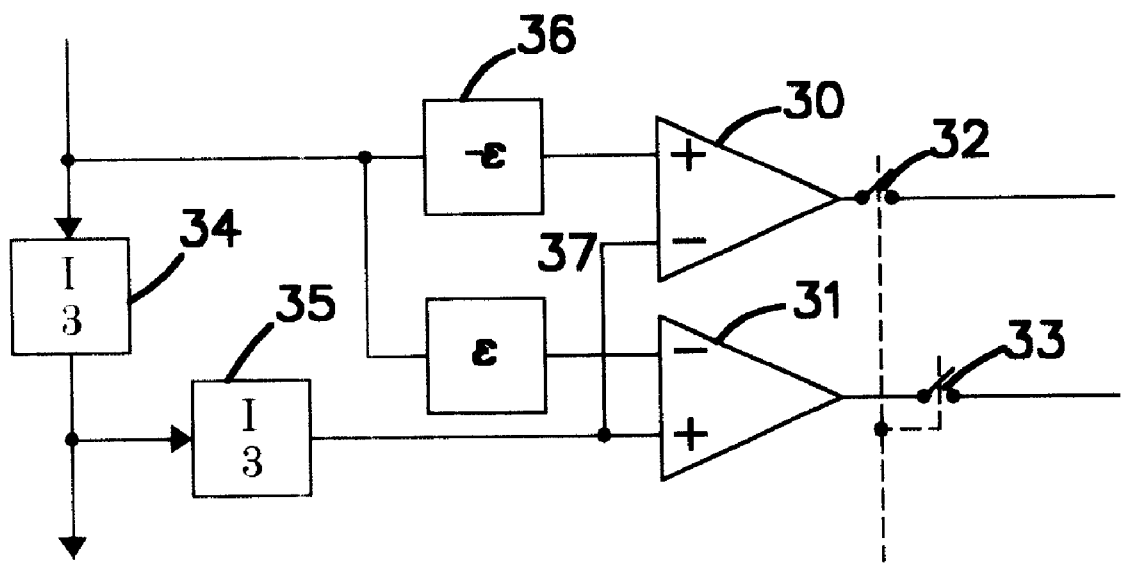

The estimators of FIGS. 2A and 2B make no provision for zero value slopes in always assigning a slope value of either 1 or −1. FIG. 2C shows a slope sign estimator for determining the presence of a zero value slope which, in this instance, creates a range of small slopes within +ε which will be considered zero value slopes. This is accomplished using the same estimator system as was used in FIG. 2A but with combining constant values of ±ε with y(t) provided by a pair of constant value adders, 36 and 37, although these values could have been combined with the delayed version of this signal for each of these comparators by changing the algebraic sign of the constant being added in the associated one of adders 36 and 37. The estimator of FIG. 2C can be represented by $$\hat{m} = \begin{cases} -1 \text{ if } y(t) + \varepsilon < y\left(t - \frac{2T}{3}\right) \\ 1 \text{ if } y(t) - \varepsilon > y\left(t - \frac{2T}{3}\right) \\ 0 \text{ if otherwise} \end{cases}.$$

The finding of a zero by this estimator results in both comparators 30 and 31, and so the sides of switches 32 and 33 connected thereto, having a binary value of "0" thereon.

Figure 2D:
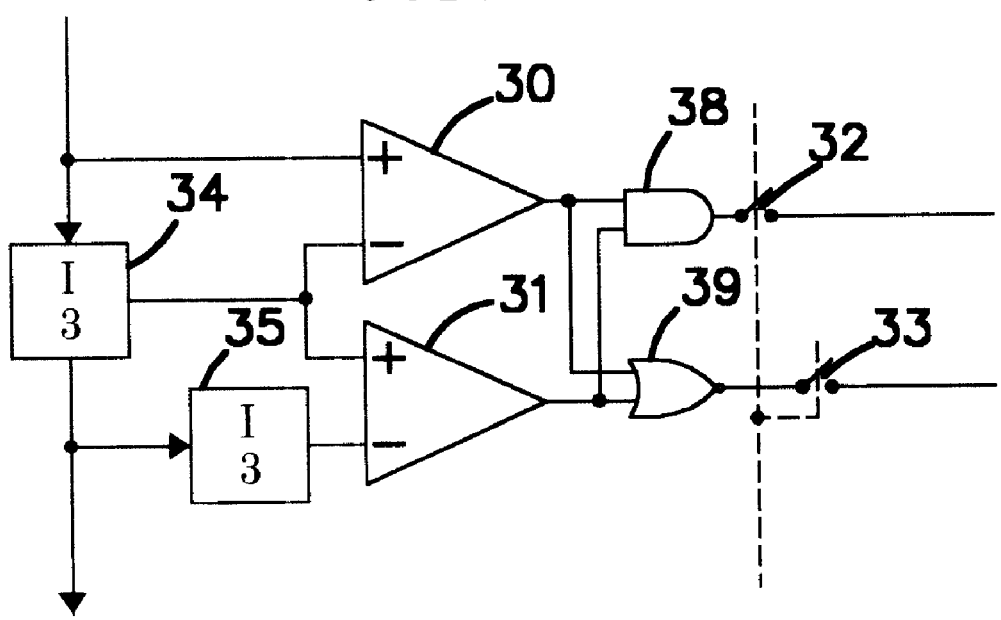

An alternate slope sign estimator is shown in FIG. 2D which checks for the consistency of slopes on each side of the sample value y(t−T/3). Where consistent on either side, either a slope of 1 or −1 is determined to have occurred. In those instances, however, where the slopes differ on opposite sides, a zero value slope is determined to have been present.

The output signal of equalizer 15 is again provided to the noninverting input of comparator 30 and delay element 34 in the slope estimator of FIG. 2D. The delayed signal from delay element 34 is provided to both the inverting input of comparator 30 and the noninverting input of comparator 31, and to the input of delay element 35. The signal so delayed through both delay elements 34 and 35 is provided to the inverting input of comparator 31. The outputs of both of comparators 30 and 31 are provided to the inputs of an AND gate, 38, and to the inputs of a NOR gate, 39. The output of gate 38 is provided to one side of switch 32, and the output of gate 39 is provided to one side of switch 33.

Thus, if y(t) is greater than y(t−T/3), and y(t−T/3) is also greater than y(t−2T/3), a consistent positive slope has been found about the sample value of y(t−T/3) and each of comparators 30 and 31 provides a binary "1" at its output which causes AND gate 38 to provide a binary "1" to switch 32. NOR gate 39, on the other hand, provides a binary "0" output in these circumstances. If the these relationships between these signal values are just the opposite, a consistent negative slope has been found about the sample value of y(t−T/3) and each of these comparators provides a binary "0" at its output which cause NOR gate 38 to provide a binary "1" to switch 33 and AND gate 38 to provide a binary "0" at its output. Other mixes of these signal value relationships indicate a zero slope with resulting binary values of "0" appearing at the outputs of gates 38 and 39. This behavior is represented by $$\hat{m} = \begin{cases} -1 \text{ if } y(t) < y\left(t - \frac{T}{3}\right) < y\left(t - \frac{2T}{3}\right) \\ 1 \text{ if } y(t) > y\left(t - \frac{T}{3}\right) > y\left(t - \frac{2T}{3}\right) \\ 0 \text{ if otherwise} \end{cases}.$$

The phase-lock oscillator loop for the retrieval or read subsystem of a magnetic data storage system based on the stochastic gradient of the squared error with respect to the timing error can than be implemented using one of these signal slope estimators and an error estimator based on differences between samples actually obtained and ideal scaled samples. A comparison between the results that can be expected for this loop with the results expected for a loop using the estimator $\hat{z}$ given above can be made by applying this latter estimator and the stochastic gradient to a common equalizer output signal. A suitable signal is the standard preamble timing signal used to start the phase-lock oscillator loop in such a subsystem which is recorded as a 50% duty cycle square wave in the magnetic storage media of a period equal to four sampling intervals. Such a signal, in being sensed in the "read head" transducer, is effectively differentiated whether the transducer is based on inductive or magnetoresistive effects. This sensed standard preamble signal would pass through an equalizer and be presented to the phase-locked loop and the sampler as $$y_{pr}(t) = \sin\left(\frac{\pi t}{2T}\right) - \cos\left(\frac{\pi t}{2T}\right).$$

The stochastic gradient based estimator, found above as $$\frac{\partial}{\partial \tau}(\text{error}[k])^2 = 2(\text{error}[kT])\frac{\partial}{\partial \tau}y(kT + \tau[kT]) = 2(\text{error}[kT])m[kT],$$

with m(kT) being the slope of the output signal at a sampling point, can be, as indicated above, reduced to $$\nabla \tau[kT] = sgn\{m[kT]\}(\text{error}[kT]).$$

Here, $\nabla \tau[kT]$ is the current estimator value and $sgn\{m[kT]\}$ is the current algebraic sign of the slope and the constant "2" is considered combined in the loop step size parameter β as indicated above. If the equalizer output signal with phase error τ[kT], ignoring any noise therein, is approximated in a Taylor's series about a sample value kT by retaining just the first order term $$y(kT + \tau[kT]) \approx y(kT) + \frac{d\,y(kT + \tau[kT])}{d\,\tau[kT]}\bigg|_{t=kT}[kT + \tau[kT] - kT] + \ldots,$$

error[kT] can be found as $$\text{error}[kT] = y(kT+\tau[kT]) - y(kT) \approx m[kT]\tau[kT]$$

to provide $$\nabla\tau[kT] = sgn\{m[kT]\}(\text{error}[kT]) = sgn\{m[kT]\}m[kT]\tau[kT] = |m[kT]|\tau[kT].$$

Thus, the slope of the standard preamble signal is needed to evaluate error[kT] or $$\frac{\partial y_{pr}(t)}{\partial t} = m_{pr}(t) = \frac{\pi}{2T}\cos\left(\frac{\pi t}{2T}\right) + \sin\left(\frac{\pi t}{2T}\right).$$

This can be evaluated at the sampling times KT as follows using the first period of the signal as characterizing the remainder of the signal without any loss in generality in view of the periodic nature of the signal:

$$m_{pr}[T] = \frac{\pi}{2T}\sin\frac{\pi}{2} = \frac{\pi}{2T},$$
$$m_{pr}[2T] = \frac{\pi}{2T}\cos\pi = -\frac{\pi}{2T},$$
$$m_{pr}[3T] = \frac{\pi}{2T}\sin\frac{3\pi}{2} = -\frac{\pi}{2T}.$$
$$m_{pr}[4T] = \frac{\pi}{2T}\cos 2\pi = \frac{\pi}{2T}$$
$$\vdots$$

Thus, the stochastic gradient estimator for the preamble signal is evaluated as $$\nabla\tau_{pr}[k] = \frac{\pi}{2T}\tau[k].$$

Turning now to the estimator $\hat{z}$, that estimator can be, from above, written as $$\hat{z}_{pr}[kT] = -\text{sample}[kT]\text{ideal}[(k-1)T] + \text{sample}[(k-1)T]\text{ideal}[kT] = -y\{kT+\tau[kT]\}y\{(k-1)T\} + y\{(k-1)T+\tau[(k-1)T]\}y\{kT\},$$

or after substituting the approximation y[kT]+m[kT]τ[kT] for y(kT+τ[kT]) as found above, there is obtained $$\hat{z}_{pr}[kT] = -\{\{y[kT]+m[kT]\tau[kT]\}\}y[(k-1)T] + \{\{y[(k-1)T]+m[(k-1)T]\tau[(k-1)T]\}\}y[kT].$$

This can be expanded to yield $$\hat{z}_{pr}[kT] = -m[kT]\tau[kT]y\{(k-1)T\} + m[(k-1)T]\tau[(k-1)T]y[kT].$$

Thus, in addition to the sample values for the derivative of the preamble signal at the sampling points, the actual sample values at those points are also needed. These values, obtained from the standard preamble signal given above on the same basis as were the values for the derivative of that signal at the sampling points, are $$y_{pr}[T] = \sin\frac{\pi}{2} = 1$$
$$y_{pr}[2T] = -\cos\pi = 1$$
$$y_{pr}[3T] = \sin\frac{3\pi}{2} = -1$$
$$y_{pr}[4T] = -\cos 2\pi = -1$$
$$\vdots$$

Using these values for the standard preamble signal at the sampling instants, and the above values for the derivative of that signal at those same instants, the estimator $\hat{z}_{pr}$ found to be $$\hat{z}_{pr}[\pi] = \frac{\pi}{2T}\{\tau[kT] + \tau[(k-1)T]\}$$

for the standard preamble signal.

Thus, comparing the estimator $\hat{z}_{pr}$ for the standard preamble signal to the stochastic gradient estimator $\nabla\tau_{pr}$ for that same signal, shows that the estimator $\hat{z}_{pr}$ is equal to the sum of the stochastic gradient estimator for the current period, $\nabla\tau_{pr}[kT]$, and the stochastic gradient estimator for the preceding sampling point, $\nabla\tau_{pr}[(k-1)T]$. This indicates that the benefits of both the stochastic gradient estimator $\nabla\tau[kT]$ and the estimator $\hat{z}$ can be obtained by a new estimator, $\nabla\Phi[kT]$, defined as a two-point moving average of the stochastic gradient estimator without any weighting or scaling coefficients used with the constituents thereof, i.e. with the coefficients of the moving average constituents set to unity, or $$\nabla\Phi[kT]\triangleq \nabla\tau[kT] + \nabla\tau[(k-1)T].$$

This combined estimator thus offers the combined benefits of the stochastic gradient based estimator, indicated above, and the two point averaging provided by the $\hat{z}$ estimator.

In view of the importance of the performance of these estimators during their initial use with the standard timing preamble to assure that the timing error correction feedback loops in which they are used "locks" onto the proper timing phase, the statistical behavior of these estimators is first compared with the standard timing preamble signal being presented to them assuming the presence of a small fixed phase error τ. The mean value of the stochastic gradient estimator then is $$E\{\nabla\tau_{pr}[k]\} = \frac{\pi}{2T}E\{\tau[k]\} = \frac{\pi\tau}{2T},$$

where the expression above for the value provided by the stochastic gradient estimator for the standard preamble timing signal has been used along with the expected value of $k^{th}$ phase error value being τ. The mean value of the moving average estimator is $$E\{\nabla\Phi_{pr}[k]\} = E\{\nabla\tau[k] + \nabla\tau[k-1]\}$$
$$= E\{\nabla\tau[k]\} + E\{\nabla\tau[k-1]\}$$
$$= \frac{\pi\tau}{2T} + \frac{\pi\tau}{2T} = \frac{\pi\tau}{T},$$

where the expression for the moving average estimator given above has been used and the independence of the phase error at each sampling instance has been assumed which is reasonable once the feedback loop in which the estimator is used has reached steady state. Since the preamble timing signal has no zero values at the sampling instants therein, the mean of the estimator $\hat{z}_{pr}$ will be equal to that of the moving average estimator.

In comparing the variances of these estimators, the feedback loops in which these estimators are used can be assumed to provide sufficient gain for the estimator output signals to operate similar voltage-control oscillators in each on a similar basis. Thus, the loop gain when using the stochastic gradient estimator will be sufficiently increased so that it will be providing a signal to the voltage-controlled oscillator which will be on a par in magnitude with the signal provided by the moving average estimator even though it has twice the number of stochastic gradient estimator contributors as does the stochastic gradient by itself. Thus, to fairly compare the estimates, the variance of the stochastic gradient estimator will be based on a multiplying of that value by two. Thus, assuming for these purposes that the phase errors at each sampling instant are independent of those of at other instants in the standard preamble timing signal, and that these errors have a mean of zero and a standard deviation of σ, the mean values of each estimator will be zero in this circumstance and the variance of the stochastic estimator is $$E\{(2\nabla\tau_{pr}[k] - 0)^2\} = E\{(2\nabla\tau_{pr}[k])^2\} = E\left\{\left(\frac{2\pi\tau[k]}{2T}\right)^2\right\}$$

$$= \frac{\pi^2}{T^2}E\{(\tau[k])^2\} = \frac{\pi^2\sigma^2}{T^2},$$

where the value for the stochastic gradient estimator operating on the standard timing preamble signal is again used along with the assumption above that the expected value of the square of the zero mean timing phase error, i.e. its variance, is equal to σ². The variance of the moving average estimator in these circumstances is $$E\{(\nabla\Phi_{pr}[k] - 0)^2\} = E\{(\nabla\Phi_{pr}[k])^2\} = E\{(\nabla\tau_{pr}[k] + \nabla\tau_{pr}[k-1])^2\}$$

$$= E\left\{\left(\frac{\pi}{2T}\tau[k] + \frac{\pi}{2T}\tau[k-1]\right)^2\right\} = \frac{\pi^2}{4T^2}E\{(\tau[k] + \tau[k-1])^2\}$$

$$= \frac{\pi^2}{4T^2}E\{\tau^2[k] + 2\tau[k]\tau[k-1] + \tau^2[k-1]\}$$

$$= \frac{\pi^2}{4T^2}(2\sigma^2) = \frac{\pi^2\sigma^2}{2T^2},$$

using again the expressions for the moving average estimator and the stochastic gradient estimator, and using the independence of the zero mean phase timing errors at each sampling instant. Thus, the moving average estimator improves the immunity to noise by about 3 db with a mean phase offset of zero.

Figure 3:
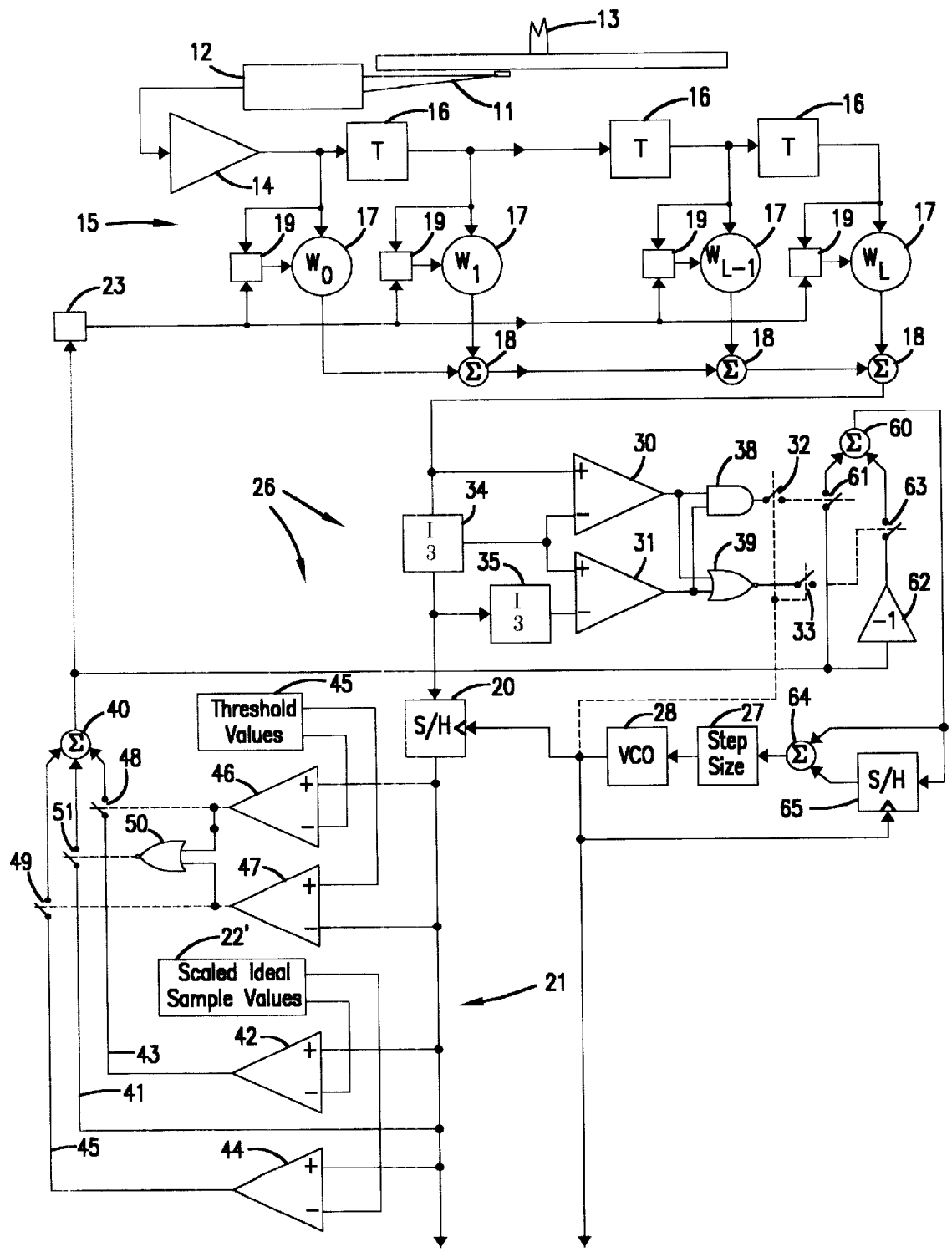
FIG. 3 is a block diagram of a timing error correction system embodying the present invention.

FIG. 3 is a block diagram of a system forming a portion of a data retrieval channel from disk 10 through sample-and-hold circuit 20 including a timing, or phase error, correction loop based on the moving average phase error estimator described above. Also, the slope sign estimator of FIG. 2D is chosen to be used as part of this loop in the system of FIG. 3. The analog signal from equalizer 15, after a delay of a third of the sample interval T/3 in delay element 34, is provided to sample-and-hold circuit 20 for sampling. The resulting sequence of sample values, y(kT+τ[k]), is provided to subsequent subsystem components in the data retrieval channel for further processing to recover the data. Also, these samples are provided as inputs to the timing, or phase error, correction feedback loop used in the data retrieval channel.

In this latter use, each of the samples from sample-and-hold circuit 20 are provided to error determiner 21 to have subtracted therefrom scaled ideal sample values for each of the three of the sample magnitudes expected to occur in the analog signal from the output of equalizer 15 at the proper sampling instants. In an ideal class 4 partial response data retrieval channel, the output of the equalizer is expected to alternatively take on one of three sample values, 1, 0 or −1, at each sampling instant. Because of asymmetries in the data retrieval channel and various scaling factors operative therein, these expected sample value possibilities are more accurately represented as the corresponding scaled ideal values of $V_{s+}$, 0 (assuming any offsets in the data retrieval channel have been corrected), and $V_{s-}$. The values provided for $V_{s+}$ and $V_{s-}$ by scaled ideal sample values source 22 are typically provided in registers in source 22 and obtained either from measurements made in the system prior to its use, or by computing averages of sample values obtained during operation of the system.

Since, as indicated, offsets are assumed to be corrected in the data retrieval channel, the expected value for samples intended to be zero value samples is zero. As a result, no subtraction is made in error determiner 21 from the current sample supplied by sample-and-hold circuit 20; rather, the current sample is directly supplied from the output of circuit 20 to an analog signal algebraic summer, 40, on a first summer input line, 41, through a switch to be described below since any sample value can be viewed as automatically having a zero value subtracted therefrom. Scaled ideal value $V_{s+}$ is supplied by source 22 to a unity gain subtractor, 42, which subtracts it from the current sample value supplied thereto by sample-and-hold circuit 20 and provides the difference on a summer input line, 43, directed to summer 40 through a switch to be described below. Finally, scaled ideal sample value $V_{s-}$ is supplied by source 22 to a further unity gain subtractor, 44, which subtracts value $V_{s-}$ from the current sample value supplied thereto by sample-and-hold circuit 20 and provides the difference on a final summer line, 45, also directed to summer 40 through a further switch to be described below.

Just which of these differences representing the possible sample error will be used to actually represent the error value for the current sample is determined by a two value threshold arrangement which compares each current sample to each of a pair of corresponding threshold values, $V_{T+}$ and $V_{T-}$. A typical magnitude for threshold value $V_{T+}$ is $V_{s+}/2$, and a typical value for threshold $V_{T-}$ is $V_{s-}/2$. A threshold source, 45, provides threshold value $V_{T+}$ to the inverting input of a first comparator, 46, and source 45 provides threshold value $V_{T-}$ to the non-inverting input of a further comparator, 47. If the value of the current sample supplied from the output of sample-and-hold circuit 20 to the non-inverting input of comparator 46 exceeds $V_{T+}$, the output of comparator 46 takes on a logic value of "1" to direct the closing of a switch, 48, in summer line 42 to thereby provide the difference determined by unity gain subtractor 42, y(kT+τ[kT])−$V_{s+}$, to summer 40. In the meanwhile, the output of comparator 47 maintains a "0" logic value at its output, which directs a further switch, 49, in summer line 45 to remain open, since the value of the current sample supplied from the output of sample-and-hold circuit 20 to the inverting input of that comparator is greater than $V_{T-}$.

If, on the other hand, the value of the current sample is more negative than $V_{T-}$, the output of comparator 47 will have a logic value "1" occur at its output to direct the closing of switch 49 to thereby allow the difference between the sample value and the scaled ideal value, y(kT+τ[kT])−$V_{s-}$, to be provided to summer 40 on summer line 45, while the output of comparator 46 remains at a logic value "0" to keep switch 48 open. Finally, should the current sample value neither exceed threshold value $V_{T+}$ nor be more negative than threshold value $V_{T-}$, each of comparators 46 and 47 will have a logic value of "0" at its output resulting in a NOR gate, 50, with its inputs connected to the outputs of comparators 46 and 47, have a "1" logic value at its output to direct the closing of a further switch, 51, to thereby allow the sample value y(kT+τ[kT]) to be directly provided to summer 40 on summer line 41. Thus, the magnitude and algebraic sign of the current sample error are determined, supplied to and passed through summer 40 to scaler 23 for equalizer 15, and to the remainder of the timing, or phase error, two point moving average estimator and, subsequently, to the remainder of the timing or phase error control feedback loop.

A further analog signal algebraic summer, 60, has either a) this original error magnitude and algebraic sign supplied by summer 40 provided thereto through a further controlled switch, 61, or b) the original error magnitude from summer 40 supplied thereto but with an inverted algebraic sign due to passing that summer 40 output signal through an analog algebraic sign inverter, 62, and another controlled switch 63. Which of these two signals is received by summer 60 in connection with the current sample is determined by the slope estimator circuit of FIG. 2D as implemented in the system shown in FIG. 3A. Thus, if the slope estimator determines a positive slope is present in connection with the current sample, slope estimator provides a "1" logic value at the output of AND gate 38 to direct the closing of switch 61 with this closing being synchronized by the initiation of the taking of the current sample by voltage-controlled oscillator 28 also closing switch 32 to provide the error magnitude and algebraic sign supplied by summer 40 to summer 60. A "0" value on the output of NOR gate 39 keeps switch 63 open even though switch 33 is closed by voltage-controlled oscillator 28.

If, instead, the slope of the equalizer output waveform associated with the current sample is determined to be negative, a "0" logic value at the output of AND gate 38 keeps switch 61 open and a "1" logic value at the output of NOR gate 39 closes switch 63 in synchronism with the initiation of the taking of the current sample by voltage-controlled oscillator 28 through that oscillator also closing switch 33 to provide the original error magnitude but with an opposite algebraic sign to summer 60. If neither a positive slope nor a negative slope is found in connection with the current sample, but rather zero slope estimate is made by the slope estimator, logic values of "0" at both of the outputs of gates 38 and 39 direct that both of switches 61 and 63 remain open even though switches 32 and 33 close so that the output of summer 60 is zero for the particular sample. Thus, the output of summer 60 is the stochastic gradient based estimator $\nabla\tau[kT]=\text{sgn}\{\hat{m}[kT](\text{error}[kT])\}$ described above using the FIG. 2D slope estimator $\hat{m}[kT]$ to provide the sign of the slope of the equalizer output signal m[kT] about the current sample also described above.

The output of summer 60 is supplied to a further portion of the phase error correction loop which creates the two point moving average estimator from the stochastic gradient based estimator signal provided at the output of summer 60. A further analog signal algebraic summer, 64, receives the current stochastic gradient based estimate $\nabla\tau[kT]$ directly from summer 60, and one sample period delayed stochastic gradient based estimate $\nabla\tau[(k-1)T]$ from a further sample-and-hold circuit, 65. Sample-and-hold circuit 65 obtains current stochastic gradient based estimates from summer 60 and holds them for one sample period, this holding initiated by the same sample initiation pulse provided by voltage-controlled oscillator 28 to sample-and-hold circuit 20.

Thus, the output of summer 64 is the two point moving average estimator $\nabla\Phi[kT]=\nabla\tau[kT]+\nabla\tau[(k-1)T]$ described above using the stochastic gradient based estimates $\nabla\tau[kT]=\text{sgn}\{\hat{m}[kT](\text{error}[kT])\}$ from summer 60 (FIG. 3 shows implementing estimator $\nabla\Phi$ but could implement estimator $\nabla\tau$ therein through the removal of sample-and-hold circuit 65). This two point moving average estimator values are provided to step size scaler 27 to be multiplied by β, the step size weighting factor. The output of scaler 27 is then used as the control voltage signal for operating voltage-controlled oscillator 28 which serves as the source of the timing, or clocking, waveforms for the rest of the data retrieval system including, as indicated, providing the sample initiation pulses for sample-and-hold circuit 20.

Figure 4A:
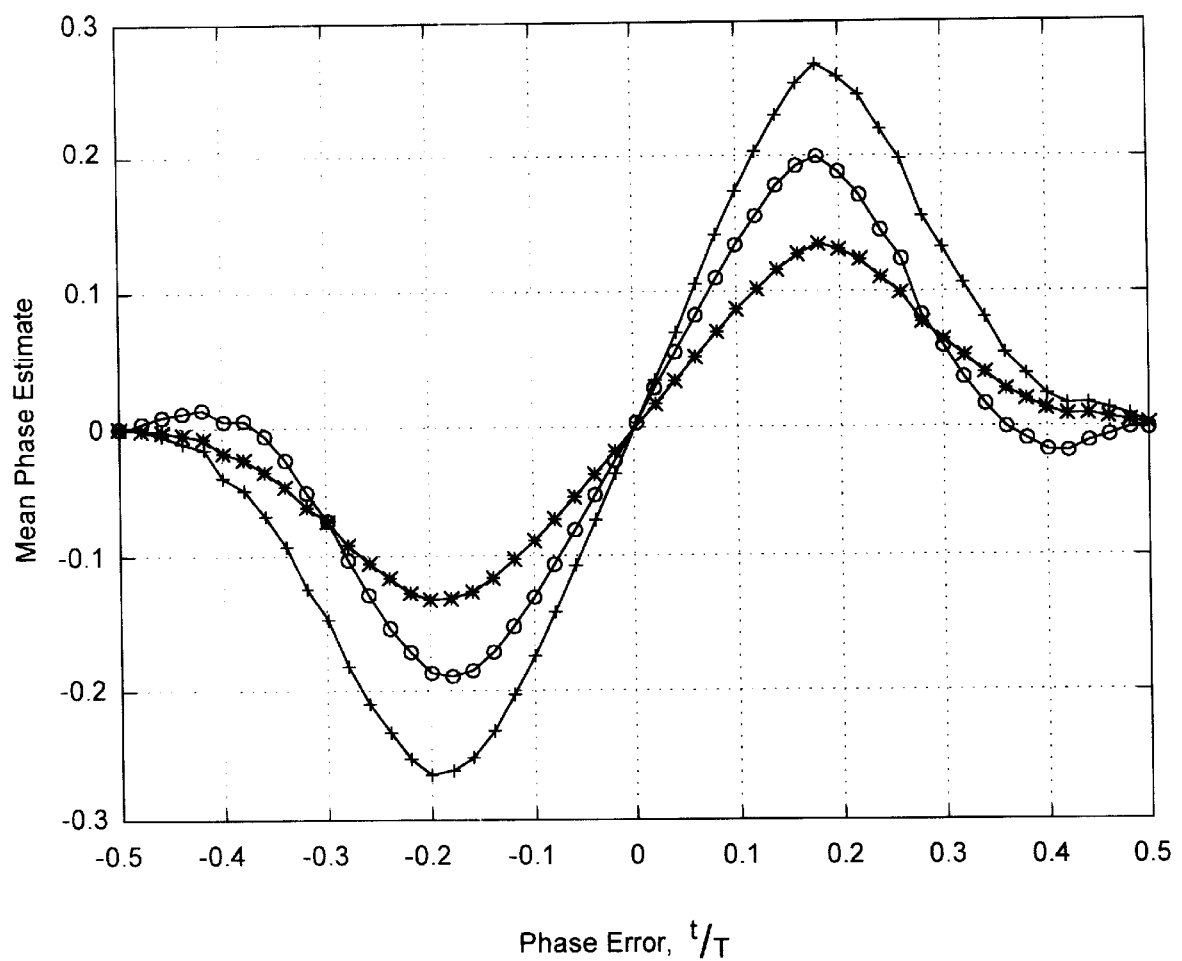
FIGS. 4A and 4B are graphs connected with the performance of the system shown in FIG. 3.

FIG. 4A provides plots of behavior of three different phase error estimators over a range of phase errors in connection with the retrieval of random stored data in the presence of noise to the extent of there being a signal to noise ratio of 15 db, the plots being of the resulting means of each of the corresponding phase estimates over a range of phase errors provided as fractions of a sampling period. The stochastic gradient based estimator $\nabla\tau$ is plotted using the data point designator "*", the estimator $\hat{z}$ is plotted using the data point designator "o", and the two point moving average estimator $\nabla\Phi$ is plotted using the data point designator "+". Smooth curves through the data points for each estimator have also been added to the plots. As can be seen, the estimator $\hat{z}$ near the outer ends of the phase error range shown actually changes algebraic sign to be of the wrong algebraic sign for correcting the phase error involved. The estimator $\nabla\tau$ and $\nabla\Phi$ both stay of the proper sign over the phase error range shown. All of the estimators are more or less linearly related to the phase error about the zero phase error value that is less than half the phase error range shown.

Figure 4B:
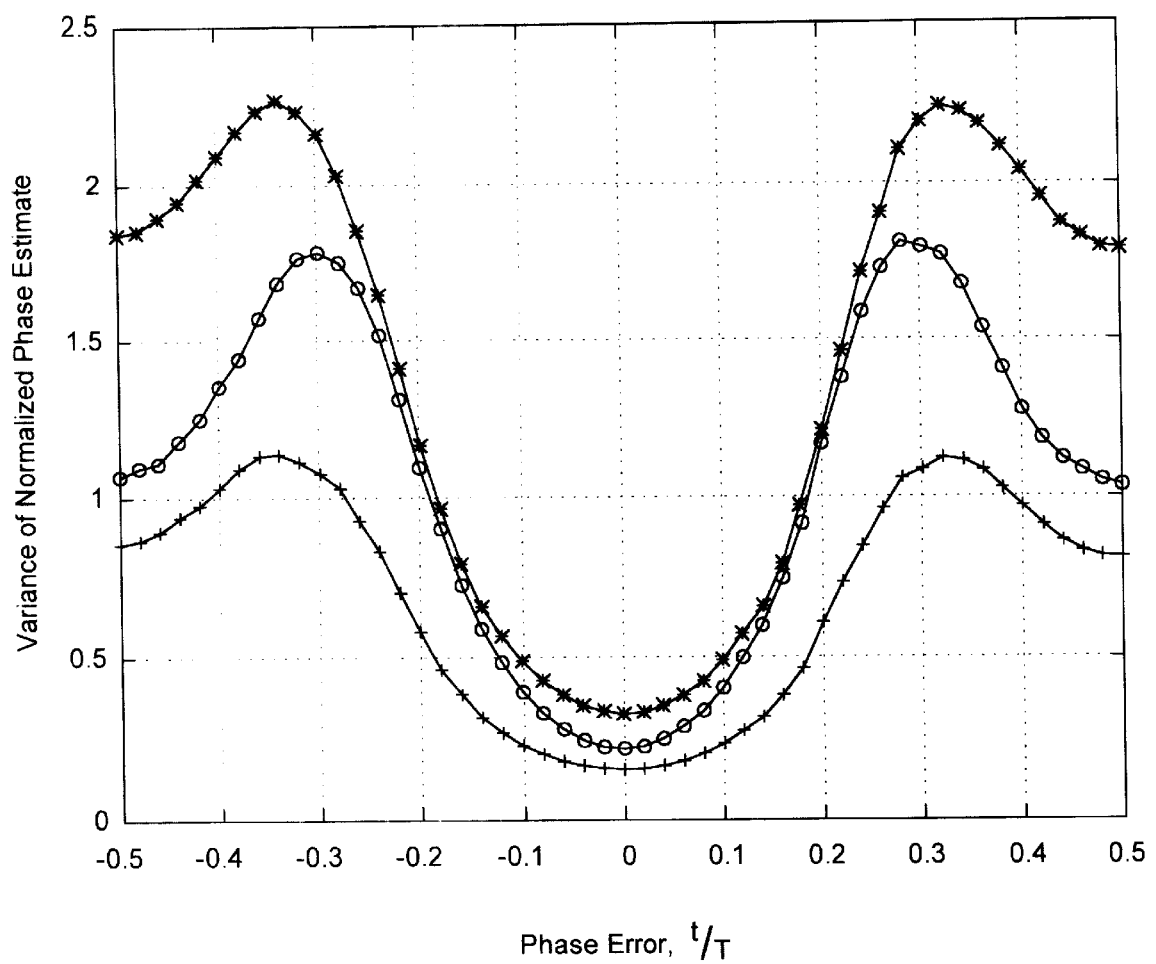

FIG. 4B shows a plot of the variance of the normalized phased estimates for these phase estimators over the phase error range again in fractions of a sampling period for random stored data in the presence of noise with the same signal-to-noise ratio. The two point moving average estimator $\nabla\Phi$ clearly shows the smallest variance among these estimators with the estimator $\hat{z}$ showing less variance than the estimator $\nabla\tau$ because of the effective averaging therein as indicated above.

The two point moving average estimator is described above on the basis of receiving all of the data samples for error determination purposes that are transmitted through the system data retrieval channel as a basis for operating the timing phase error correction feedback loop. However, as indicated above, a class 4 partial response system can be viewed as the interleaving of two sets of samples, the even samples and the odd samples, i.e. as two dicode channels each operating at half the sampling rate used for sampling with the full partial response channel. Thus, the moving average estimator could be used in a feedback loop for controlling the timing for a half sampling rate dicode channel to provide the basis for establishing timing phase error corrections therein. In this circumstance, the moving average estimator described above is given effect in every other sampling period but must be combined with a zero value in the intervening sampling periods when the other dicode channel is acquiring the next data sample. As a result, a combined moving average phase error estimator is, in the instance of one of the dicode channels, of the following form:

$$\nabla\Psi[k] = \begin{cases} 0 \text{ if } k \text{ is even} \\ \nabla\tau[k] + \nabla\tau[k-1] \text{ if } k \text{ is odd} \end{cases}.$$

The statistical behavior of this estimator can be found assuming that some phase error is present so that the stochastic algorithm estimator $\nabla\tau[k]$ has a mean value of $m_c$ in this combined estimator and a variance of $\sigma_c^2$. In these circumstances, the mean of the combined estimator over the half rate sampling period is $$E\{\nabla\Psi\} = E\{0|_{k \text{ even}} + (\nabla\tau[k] + \tau[k=1])|_{k \text{ odd}}\}$$
$$= 1/2E\{0\} + 1/2E\{\nabla\tau[k] + \tau[k+1]\}$$
$$= 0 + 1/2E\{\nabla\tau[k]\} + 1/2E\{\nabla\tau[k-1]\}$$
$$= 1/2m_c + 1/2m_c = m_c,$$

where the likelihood of the occurrence of each estimator value in the half-rate sampling period is taken to be equal. The variance of the combined estimator is then $$E\{(\nabla\psi - m_c)^2\} = E\{\{0|_{k \text{ even}} + (\nabla\tau[k] + \tau k - 1])|_{k \text{ odd}} - m_c\}^2\}$$
$$= \frac{1}{2}E\{(0 - m_c)^2\} + \frac{1}{2}E\{(\nabla\tau[k] + \nabla\tau[k-1] - m_c)^2\}$$
$$= \frac{m_c^2}{2} + \frac{1}{2}E\{\tau^2[k] + \tau^2[k-1] + 2\tau[k]\tau[k-1] - $$
$$2m_c\tau[k] - 2m_c\tau[k-1] + m_c^2\}$$
$$= \frac{m_c^2}{2} + \frac{1}{2}E\{\tau^2[k] - 2m_c\tau[k] + m_c^2 + \tau^2[k-1] - $$
$$2m_c\tau[k-1] + m_c^2 + 2\tau[k]\tau[k-1] + m_c^2 - m_c^2 - m_c^2\}$$
$$= \frac{m_c^2}{2} + \frac{1}{2}(\sigma_c^2 + \sigma_c^2 + 2m_c^2 + m_c^2 - m_c^2 - m_c^2)$$
$$= \frac{m_c^2}{2} + \sigma_c^2 + \frac{m_c^2}{2} = \sigma_c^2 + m_c^2,$$

where the independence of the timing phase errors at each sampling instant has been used. Thus, the combined moving average estimator has a variance which is dependent on its mean value making this estimator less suitable for controlling the timing phase error in a dicode channel as compared to using the moving average estimator to control the timing phase error in the full partial response channel.

Another caveat in connection with use of phase error estimators in phase timing error correction loops using error information based on samples of the channel signal is the possibility of a "hang-up" in the loop at an erroneous nonzero timing phase error value during the use of the timing preamble at the initiation of loop timing phase error control activity. If the timing preamble is sampled at times t=kT, the samples will have values of either the positive or the negative peak values in the equalizer waveform, as indicated above, and the corresponding mean timing error will be driven to zero in the described system to thereby lock the loop to a zero phase error. However, if the initial timing phase error is sufficiently great so that the signal is sampled at times t=kT+T/2, the channel signal will be sampled at peak values but also at zero crossing values which will also result in the mean timing error being driven to zero in this system to lock the loop to lock the loop to a T/2 phase error.

This last result is avoided by using a zero phase restart procedure to start the data retrieval channel system each time its operation is again desired after a period of inactivity. In this procedure, during an initial training period, the phase of voltage-controlled oscillator 28 at initiation is coordinated to be near zero along with generating an estimate of the pattern positive and negative peak values of the timing preamble being received that is used to generate corresponding noiseless samples to control switches 48, 49 and 51. This allows the establishing of values for $V_{s+}$ and $V_{s-}$ sufficiently for the sample errors to become small enough to assure the timing errors are also sufficiently small for the loop to lock onto zero phase error.

Figure 5:
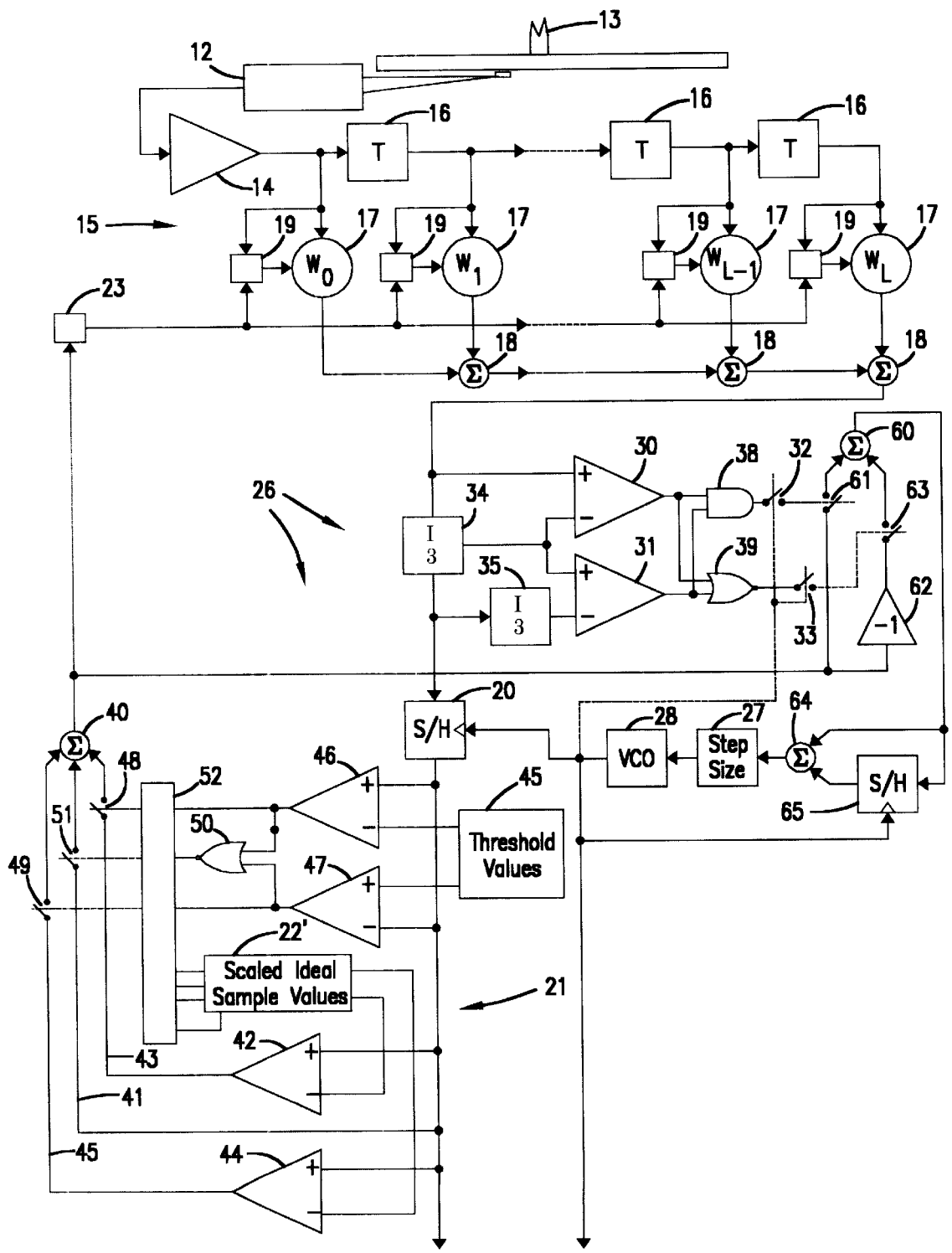
FIG. 5 is a block diagram of a timing error correction system embodying the present invention.

FIG. 5 shows the data retrieval channel system of FIG. 3 modified to be capable of performing this procedure. Rather than switches 48, 49 and 51 being operated by signals at the outputs of comparators 46 and 47 and NOR gate 50, respectively, these outputs are connected to the inputs of a multiplexer, 52, to be selectively connectable to control these switches through the outputs of that multiplexer. The scaled ideal values source, redesignated 22' in FIG. 5, is involved with system control to also provide, through outputs thereof connected to further inputs of multiplexer 52, output signals that are, in effect, noiseless samples to control switches 48, 49 and 51, and to provide a further output to direct multiplexer 52 as to which set of its inputs to connect to its outputs.

Figure 6A:
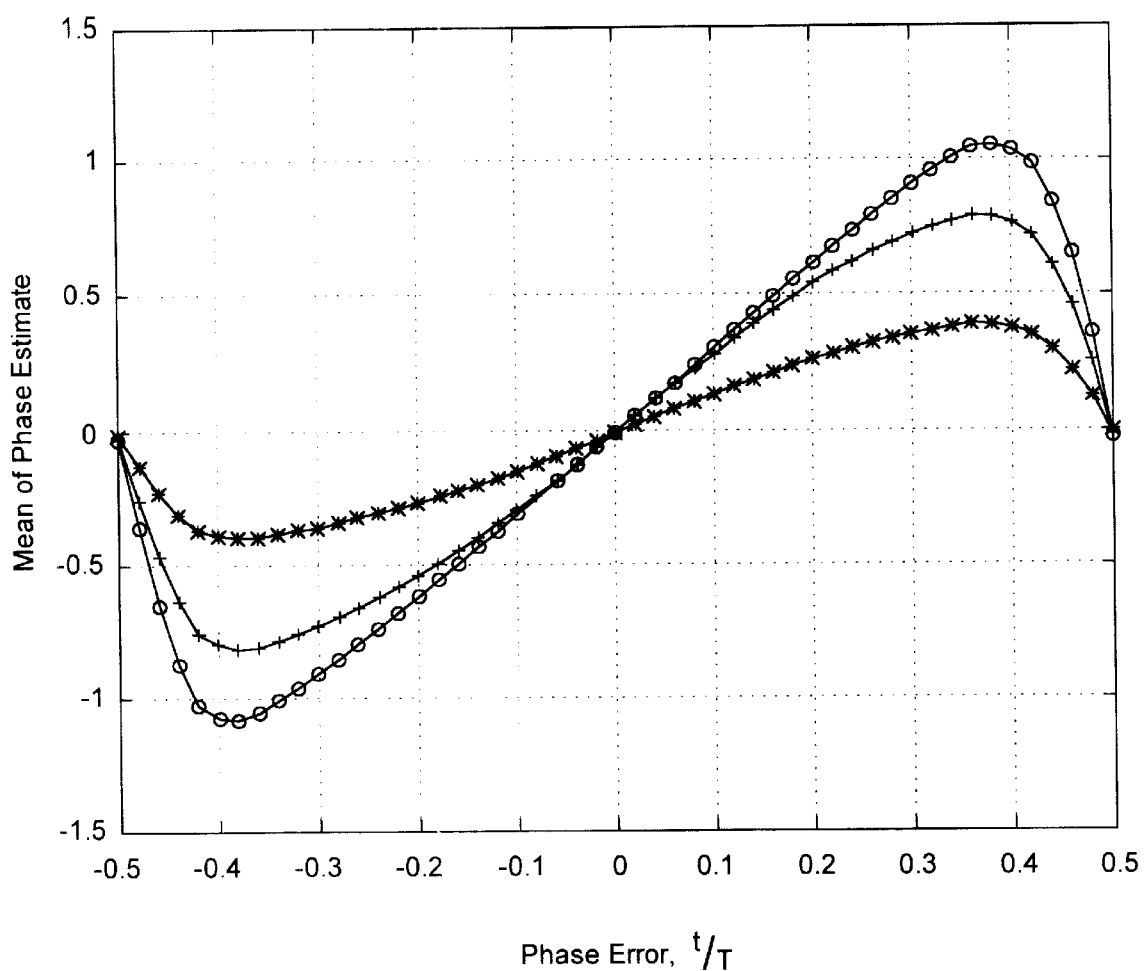
FIGS. 6A and 6B are graphs connected with the performance of the system shown in FIG. 5.
Figure 6B:
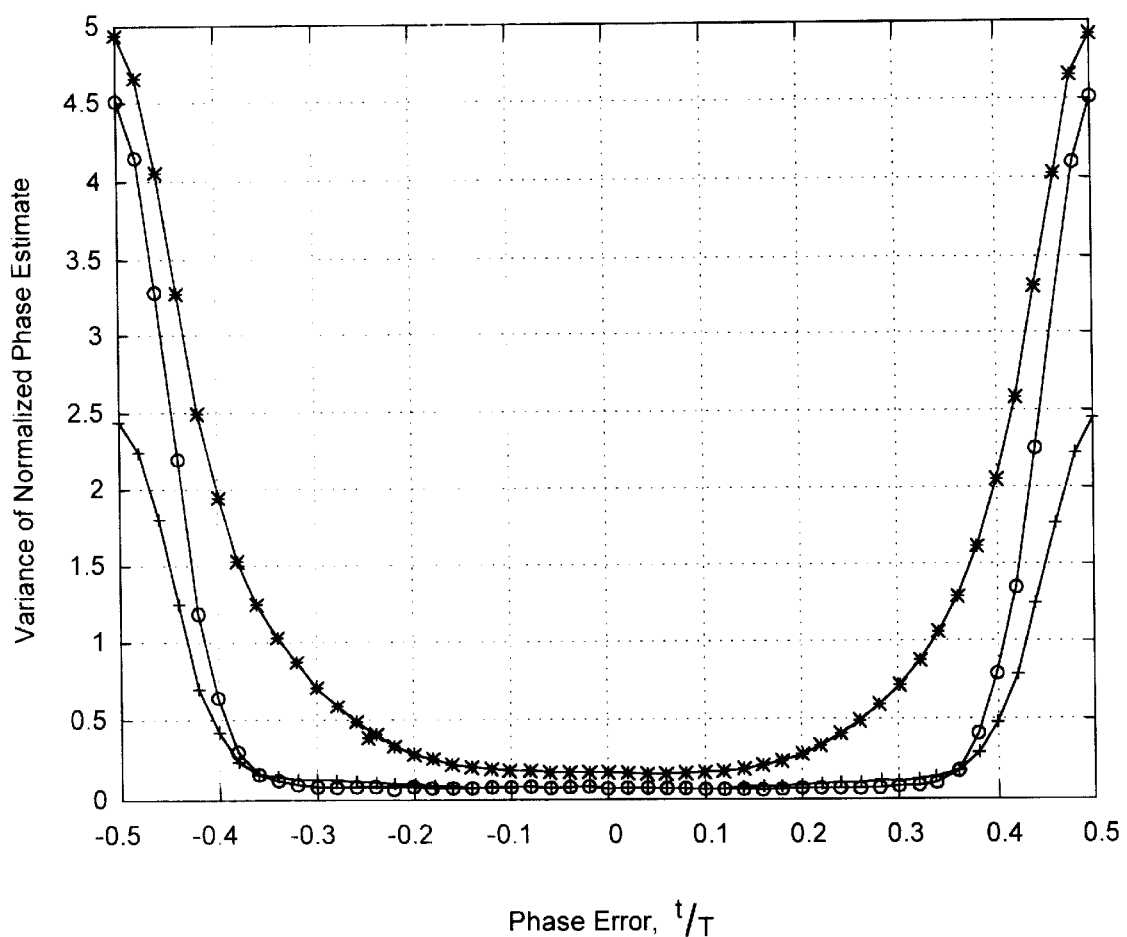

FIG. 6A provides plots showing the behavior of the mean phase estimates from estimators $\nabla\tau$, $\hat{z}$ and $\nabla\Phi$ that can be expected in a system like that shown in FIG. 5 (which again is shown implementing estimator $\nabla\Phi$ and could implement estimator $\nabla\tau$ therein through the removal of sample-and-hold circuit 65) operating on the standard timing preamble from equalizer 15 in the presence of noise to the extent of a there being a signal-to-noise ratio of 15 db. The mean phase estimate has a much larger linear range for the standard timing preamble than for random data, and none of the estimators produce mean phase estimates having an incorrect algebraic sign in the phase error range shown using this procedure. FIG. 6B provides plots showing the behavior of the variances of the normalized phase estimates from these estimators in these circumstances with the two point moving average estimator again showing the smallest variance over the range of phase errors plotted.

Although the present invention has been described with reference to preferred embodiments, workers skilled in the art will recognize that changes may be made in form and detail without departing from the spirit and scope of the invention.

What is claimed is:

1. A phase detector for a timing control loop provided in a signal sampling system to control acquisitions of samples, separated from one another by corresponding sampling intervals, of magnitudes of input signals provided at an input of said signal sampling system by a sampler that forms sequences of said samples of those input signals at an output thereof which are supplied to a data output of said signal sampling system, said phase detector comprising:

- a slope estimator having a slope indication output and having a first signal input coupled to said signal sampling system input, said slope estimator being capable of determining magnitude values of said input signals provided at said signal sampling system input during said sampling intervals to provide therefrom estimates of slopes of such signals for corresponding said sampling intervals, and of providing indications of said slope estimates at said slope indication output thereof;
- an error determiner having a signal input coupled to said sampler output to receive said samples and having a magnitude error output, said error determiner being capable of providing indications of error magnitudes at said output thereof corresponding to those said samples received thereby based on differences in magnitude occurring between such said samples and expected values therefor;
- a phase error estimation combiner having an output, and having a slope indication input coupled to said slope estimator slope indication output and an error indication input coupled to said error determiner magnitude error output, said phase error estimation combiner being capable of providing phase error estimates at said output thereof for corresponding said sampling intervals based on signals occurring at said error indication input thereof as selectively modified by signals provided at said slope input thereof;
- a first signal delayer having an input coupled to said phase error estimation combiner output and having an output, said first signal delayer being capable of delaying signals provided at said input thereof for transmission therethrough to said output thereof for a said sampling interval; and
- a summer having an output, a first input coupled to said phase error estimation combiner output and a second input coupled to said first signal delayer output, said summer being capable of providing an output signal at said output thereof which is an algebraic sum of corresponding signals provided on said first and second inputs thereof.

2. The apparatus of claim 1 wherein said phase error estimation combiner receives said indications of error magnitudes at said error indication input thereof in corresponding sampling intervals and provides from each such error magnitude indication a corresponding indication of an opposite polarity error magnitude, and wherein said phase error estimation combiner comprises a selector for selectively modifying said signals occurring at said error indication input thereof by signals provided at said slope input thereof which alternatively selects at least either a said indication of error magnitude or a corresponding said indication of an opposite polarity error magnitude to appear at said phase error estimation combiner output based on corresponding said indications of slope estimates provided at said slope indication input thereof.

3. The apparatus of claim 2 wherein said phase error estimation combiner selectively modifies said signals occurring at said error indication input thereof in a further alternative of reducing them to a zero value.

4. The apparatus of claim 1 wherein said slope estimator has a clocking input and provides said indications of slope estimates at said slope indication output thereof upon corresponding receptions of indicating signals on said clocking input thereof.

5. The apparatus of claim 1 further comprising a controlled signal generator having an input electrically connected to said phase error estimation combiner and having an output electrically connected to said sampler to permit said phase error estimates provided at said phase error estimation combiner output to control characteristics of output signals provided by said control signal generator at said output thereof which control acquisitions of samples by said sampler.

6. The apparatus of claim 5 wherein said slope estimator has a clocking input and provides said indications of slope estimates at said slope indication output thereof upon corresponding receptions of output signals on said clocking input thereof from said controlled signal generator output.

7. A phase detector for a timing control loop provided in a signal sampling system to control acquisitions of samples, separated from one another by corresponding sampling intervals, of magnitudes of input signals provided at an input of said signal sampling system by a sampler that forms sequences of said samples of those input signals at an output thereof which are supplied to a data output of said signal sampling system, and phase detector comprising:

- a first signal delayer having an input coupled to said signal sampling system input and having an output, said first signal delayer being capable of delaying signals provided at said input thereof for transmission therethrough to said output thereof for a selected fraction of a current one of said sampling intervals;
- a slope estimator having a slope indication output and having a first signal input coupled to said first signal delayer at one of said input and output thereof, said slope estimator being capable of determining magnitude values of signals transmitted through said first signal delayer during said sampling intervals to provide therefrom estimates of slopes of such signals for corresponding said sampling intervals, and of providing indications of said slope estimates at said slope indication output thereof;
- an error determiner having a signal input coupled to said sampler output to receive said samples and having a magnitude error output, said error determiner being capable of providing indications of error magnitudes at said output thereof corresponding to those said samples received thereby based on differences in magnitude occurring between such said samples and expected values therefor; and
- a phase error estimation combiner having an output, and having a slope indication input coupled to said slope estimator slope indication output and an error indication input coupled to said error determiner magnitude error output, said phase error estimation combiner being capable of providing phase error estimates at said output thereof for corresponding said sampling intervals based on signals occurring at said error indication input thereof as selectively modified by signals provided at said slope input thereof.

8. The apparatus of claim 7 further comprising a second signal delayer having an input electrically connected to said first signal delayer output and having an output electrically connected to a second signal input of said slope estimator, said second signal delayer being capable of delaying signals provided at said input thereof for transmission therethrough to said output thereof for a selected fraction of a current one of said sampling intervals, said slope estimator being capable of determining magnitude values of signals transmitted through said first and second signal delayers during said sampling intervals to provide therefrom estimates of slopes of such signals for corresponding said sampling intervals.

9. The apparatus of claim 8 wherein said slope estimator has a clocking input and provides said indications of slope estimates at said slope indication output thereof upon corresponding receptions of indicating signals on said clocking input thereof.

10. The apparatus of claim 8 wherein said phase error estimation combiner receives said indications of error magnitudes at said error indication input thereof in corresponding sampling intervals and provides from each such error magnitude indication a corresponding indication of an opposite polarity error magnitude, and wherein said phase error estimation combiner comprises a selector for selectively modifying said signals occurring at said error indication input thereof by signals provided at said slope input thereof which alternatively selects at least either a said indication of error magnitude or a corresponding said indication of an opposite polarity error magnitude to appear at said phase error estimation combiner output based on corresponding said indications of slope estimates provided at said slope indication input thereof.

11. The apparatus of claim 10 wherein said phase error estimation combiner selectively modifies said signals occurring at said error indication input thereof in a further alternative of reducing them to a zero value.

12. The apparatus of claim 7 wherein said phase error estimation combiner receives said indications of error magnitudes at said error indication input thereof in corresponding sampling intervals and provides from each such error magnitude indication a corresponding indication of an opposite polarity error magnitude, and wherein said phase error estimation combiner comprises a selector for selectively modifying said signals occurring at said error indication input thereof by signals provided at said slope input thereof which alternatively selects at least either a said indication of error magnitude or a corresponding said indication of an opposite polarity error magnitude to appear at said phase error estimation combiner output based on corresponding said indications of slope estimates provided at said slope indication input thereof.

13. The apparatus of claim 12 wherein said phase error estimation combiner selectively modifies said signals occurring at said error indication input thereof in a further alternative of reducing them to a zero value.

14. The apparatus of claim 7 wherein said slope estimator has a clocking input and provides said indications of slope estimates at said slope indication output thereof upon corresponding receptions of indicating signals on said clocking input thereof.

15. The apparatus of claim 7 further comprising a controlled signal generator having an input electrically connected to said phase error estimation combiner and having an output electrically connected to said sampler to permit said phase error estimates provided at said phase error estimation combiner output to control characteristics of output signals provided by said control signal generator at said output thereof which control acquisitions of samples by said sampler.

16. The apparatus of claim 15 wherein said slope estimator has a clocking input and provides said indications of slope estimates at said slope indication output thereof upon corresponding receptions of output signals on said clocking input thereof from said controlled signal generator output.

* * * * *